United States Patent [19]
Teng et al.

[11] Patent Number: 5,721,033
[45] Date of Patent: Feb. 24, 1998

[54] MAGNETIC RECORDING DISC HAVING A SUBSTRATE, OXIDE LAYER, AND A TEXTURE LAYER OF DISCRETE GLOBULES OF INDIUM-BISMUTH EUTECTIC ALLOY

[75] Inventors: Edward F. Teng, Sunnyvale; Phuong Nguyen, Milpitas; Atef H. Eltoukhy, Saratoga, all of Calif.

[73] Assignee: StorMedia, Inc., Santa Clara, Calif.

[21] Appl. No.: 684,854

[22] Filed: Jul. 25, 1996

Related U.S. Application Data

[62] Division of Ser. No. 296,958, Aug. 26, 1994, Pat. No. 5,620,574.
[51] Int. Cl.⁶ ........................................ G11B 5/66
[52] U.S. Cl. .................. 428/65.3; 428/148; 428/323; 428/332; 428/642; 428/694 SG; 428/694 TS; 428/900
[58] Field of Search ................... 428/65.3, 148, 428/323, 332, 642, 694 SG, 694 TS, 900

[56] References Cited

U.S. PATENT DOCUMENTS

| | | | |
|---|---|---|---|
| 5,053,250 | 10/1991 | Baseman et al. | 427/131 |
| 5,192,626 | 3/1993 | Sekiya et al. | 428/694 |
| 5,413,835 | 5/1995 | Ikeda | 428/141 |
| 5,421,975 | 6/1995 | Mahvan | 204/192.15 |

OTHER PUBLICATIONS

Teng et al, "Sputter–Induced Random Micro Texturing on NiP Plated Aluminum and Alternate Substrates", *6th Joint MMM–Intermag Conference* at Albuquerque, New Mexico Jun. 1994.

*Primary Examiner*—Stevan A. Resan
*Attorney, Agent, or Firm*—Lahive & Cockfield, LLP

[57] ABSTRACT

Sputter induced micro-texturing of thin film magnetic media discs entailing the formation of micro-texturing globules comprising a eutectic alloy of Indium and Bismuth.

4 Claims, 3 Drawing Sheets

MAGNETIC RECORDING DISC HAVING A SUBSTRATE, OXIDE LAYER, AND A TEXTURE LAYER OF DISCRETE GLOBULES OF INDIUM-BISMUTH EUTECTIC ALLOY

This application is a divisional application of Ser. No. 08/296,958 filed on Aug. 26, 1994, now U.S. Pat. No. 5,620,574. The contents of all of the aforementioned application(s) are hereby incorporated by reference.

GENERAL BACKGROUND OF INVENTION

1. Related Application

This application is related in subject matter to U.S. patent application Ser. No. 275,969, filed Jul. 15, 1994, entitled "Enhanced Methods And Apparatus For Producing Micro-Textured, Thin Film, Magnetic Disc Media And Compositely Micro-Textured Disc Media Produced Thereby", assigned to the assignee of the present application, and identifying Teng, Eltoukhy, Clark, and Goh as co-inventors. The disclosure of this application Ser. No. 275,969 is herein incorporated by reference as depicting one preferred mode for practicing the present invention in the context of composite texturing of thin film media.

2. Present Invention

This application depicts a uniquely advantageous application of the sputter induced micro-texturing (SIMT) as described in the above noted, prior application Ser. No. 275,969, this present invention being directed to micro-texturing itself produced by the sputtering of eutectically alloyed Indium/Bismuth on an appropriate substrate.

The present invention is characterized by the application of sputter induced micro-texturing utilizing eutectic alloy gloubles of Indium and Bismuth, with the application of this sputter induced micro-texturing (SIMT) not being limited to a multi stage process, as described in the aforesaid application Ser. No. 275,969, and either 1) entailing the preconditioning of a normally wettable substrate such as an aluminum substrate treated with nickel phosphorous (NIP), to render the substrate substantially non-wettable so as to enhance the globule formation of the SIMT material, or 2) being applicable to an originally non-wettable substrate, such as glass, etc..

As is noted in the aforesaid United States patent application Ser. No. 275,969, as the development of thin film magnetic disc media has evolved, certain problems have existed with respect to the attainment of optimal disc operating conditions and magnetic properties.

One particular problem of concern has involved the maintenance of suitable, low friction characteristics on the exposed disc surface, this traditionally being attained by fluid lubricant materials being applied to the disc surface to be read by a magnetic head.

While efforts to apply and maintain such lubricant coatings have engendered substantial research effort, particular attention has been devoted to the formation of roughened or textured media surfaces. These textured surfaces provide alternating arrays of recesses and peaks which are intended to prevent migration of lubricant and undesired, localized lubricant build-up or loss and reduce friction and sticking between the disk and landed head, ie., reduce stiction.

The disadvantage of providing such texturing (usually mechanical) is that it frequently caused undesired, extremely high modulation disparity due to the differences in elevation between portions of the thin film media being traversed by the magnetic head and also tended to cause head damage. (As used herein, the term elevation refers to the difference in displacement of features as measured generally parallel to the axis of disc rotation.)

The present invention is uniquely concerned with the presentation of new and enhanced micro-texturing techniques and apparatus, and the resulting thin film, magnetic media disc product, such being characterized by the attainment of reduced modulation disparity, while effectively controlling the distribution of lubricant during disc operation so as to avoid head sticking problems. These problems commonly are referred to as entailing "stiction", such being produced when heads inadvertently come to rest on disc areas having excessive lubricant accumulation. In addition, optimal head glide characteristics are preserved.

The unique texturing approach of this invention is characterized by SIMT which produces uniform and consistent micro-texturing on appropriate substrates. If such are initially wettable by the SIMT material, i.e., globules of a eutectic alloy of Indium and Bismuth, the substrate is conditioned through the practice of this invention, so as to become generally non-wettable by the SIMT globules, thereby permitting the attainment and maintenance of a surface texturing globule formation.

Invention Overview—Presently Preferred Embodiment

In the micro-texturing process of this invention, a eutectic, seed layer formation and micro-texturing treatment is implemented so as to provide a solidified, eutectic alloy, rounded globule-defined, texturing. These solidified eutectic alloy globules comprise a eutectic, Indium and Bismuth alloy.

With respect to the alloy globule features of the present invention, prior art U.S. patents such as Baseman et al U.S. Pat. No. 5,1334,038 (1992) and U.S. Pat. No. 5,053,250 (1991) do disclose a form of globule formation. However, these IBM patents appear to be restricted to situations where there is an interaction between the magnetic media layer and globules while they are in a transient, liquid stage. No such phenomena as taught by Baseman et al is believed to be involved in connection with the eutectic alloy approach of this present invention. Moreover, the disclosed globule reactivity and disparity in globule size and configuration as disclosed by Baseman et al appear to be effectively avoided by the practice of this present invention.

In addition, a prior United States patent application, Ser. No. 959,986, filed Oct. 13, 1992, assigned to assignee of this present application, identifying Mahvan et al as co-inventors and entitled "Method And Apparatus For Enhancing The Magnetic And Roughness Properties Of Thin Film Magnetic Recording Media And The Resulting Enhanced Media" discloses the use of certain peritectic alloys which are sputter deposited to form texturing on initially non-wettable substrates such as glass. Neither the eutectic Indium/Bismuth alloy of this invention nor the substrate conditioning step of one preferred embodiment of this invention are contemplated in this prior application.

General State Of The Art Summary

By way of summarizing the general state of the art, the following compilation of United States patents, and a Pilkington EPO application, generally are indicative of the various approaches which have been pursued in connection with micro-texturing technology. In this compilation, at the end of each patent title, a code has been applied, generally indicating the principle nature of the disclosure and claimed subject matter, with the meaning of these codes being identified in the code table at the end of the patent listing.

| ITEM NUMBER | INVENTOR | ASSIGNEE | TITLE (SUBJECT) |
|---|---|---|---|
| EPO Application | | | |
| 579,399,A2 | Wilson et al | Pilkington Brothers, PLO | Glass Substrate For A Magnetic Disc And Manufacture Therefore (ME) |
| U.S. Pat. Nos. | | | |
| 3,019,125 | Eggenberger et al | IBM | Thin Magnetic Film (CG) |
| 3,193,362 | Hespenheide | Burroughs Corp. | Magnetic Materials (M) |
| 4,326,229 | Yanagisawa | Nippon Electric Co. | Magnetic Record Member And Process For Manufacturing The Same (M) |
| 4,499,122 | Economy et al | IBM | Process For Finishing Surfaces Achieving Improved Magnetic Disk Performance (P) |
| 4,616,237 | Pettigrew et al | Pa Management Consultants, Ltd. | Data Storage Medium (CG) |
| 4,675,075 | Sakai et al | Fujitsu Limited | Magnetic Recording Production Processes (ME)(H) |
| 4,698,251 | Fukuda et al | Victor Company of Japan, Limited | Magnetic Recording Medium And Method Of Producing The Same (CG) |
| 4,724,444 | Pelligrew et al | Plasmon Data Systems, Inc. | Data Storage Medium (CG) |
| 4,734,810 | Nakayama et al | TDK Corporation | Magnetic Recording Medium Comprising Protrusion On Its Surface And A Plasma Treated Substrate And Recording/Reproducing Method Therefor (PE) |
| 4,375,840 | Hedgcoth | Cyberdisk, Inc. | Magnetic Recording Disk And Sputtering Process And Apparatus For Producing Same (CG) |
| 4,828,899 | Arioka et al | TDK Corporation | Magnetic Recording Medium And Recording/Reproducing Method Thereof (P) |
| 4,833,001 | Kijima et al | Asahi Glass Company, Ltd. | Glass Substrate For A Magnetic Disc And Process For Its Production (CE) |
| 4,894,133 | Hedgcoth | Virgle L. Hedgcoth | Method And Apparatus Making Magnetic Recording Disk (CG) |
| 4,925,738 | Tsuya et al | — | Substrate For A Magnetic Disk And Process For Its Production (PO) (CE) |
| 4,393,614 | Shirakura et al | Hitachi, Ltd. | Magnetic Disk Medium With Circumferentially Textured Surfaces And Varied Surface Roughness And Method Of Producing Same (CG) |
| 4,973,496 | Kruger et al | IBM | Method For Texturing Magnetic Disks (CG) |
| 4,985,306 | Morizane et al | — | Base Plate For Recording Disk And A Method For Its Manufacture (CE) |
| 4,996,622 | Takatsuki et al | Nippon Sheet Glass Co., Ltd. | Magnetic Disk With Textured Area On Part Of Disk (CG) |
| 5,047,274 | Tsuya et al | — | Annodized Aluminum Substrate For A Magnetic Recording Disk In Which Pores Are Filled With A Non Magnetic Material And The Surface Polished And Etched (PP) |
| 5,053,250 | Baseman et al | IBM | Thin Film Magnetic Medium With Controlled Grain Morphology And Topology For Improved Performance (G) |
| 5,062,021 | Ranjan et al | Magnetic Peripherals, Inc. | Selectively Textured Magnetic Recording Media (L) |
| 5,070,425 | Inumoch | Mitsubishi Denki Kabushiki Kaisha | Surface Structure Of A Magnetic Disk (CG) |
| 5,074,971 | Tsuya et al | — | Process For Preparing Magnetic Disk (PO) (CE) |
| 5,079,062 | Masuda et al | Hitachi, Ltd. | Magnetic Recording Medium Having A Thin Film Magnetic Layer Formed Over A Non-Magnetic Substrate Which Has Powder Grains Of The Substrate Dipsosed On Its Surface (P) |
| 5,082,709 | Suzuki et al | Matsushita Electric | Thin Film-Type Magnetic Disk (P) |

-continued

| ITEM NUMBER | INVENTOR | ASSIGNEE | TITLE (SUBJECT) |
|---|---|---|---|
| 5,082,747 | Hedgcoth | Industrial Co., Ltd. — | Magnetic Recording Disk And Sputtering Process And Apparatus For Producing Same (CG) |
| 5,087,481 | Chen et al | Komag, Inc.; Asahi Glass Co., Ltd. | Method For Texturing A Magnetic Disk Silicate Glass Substrate (CE) |
| 5,087,482 | Kawai et al | Hoya Corporation | Method Of Manufacturing Magnetic Recording Medium Capable Of Recording Information At A High Recording Density (P) |
| 5,091,225 | Goto | NEC Corporation | Magnetic Disk Member And Process For Manufacturing The Same (P) |
| 5,093,173 | Nakagawa et al | Hitachi, Ltd. | Magnetic Disk Comprising A Substrate Of An Amorphous Glass Continuous Phase Dispersed With Crystal Particles Which Produce A Structurally Defined Surface On The Substrate (CB) |
| 5,108,781 | Ranjan et al | Magnetic Peripherals, Inc. | Process For Manufacturing Selectively Textured Magnetic Recording Media (L) |
| 5,108,812 | Takahashi et al | — | Substrate For A Magnetic Disk And Process For Its Production (PP) |
| 5,119,258 | Tsai et al | HMT Technology Corporation | Magnetic Disk With Low-Friction Glass Substrate (PE) |
| 5,134,038 | Baseman et al | IBM | Thin Film Magnetic Recording Medium With Controlled Grain Morphology And Topology (G) |
| 5,166,006 | Lal et al | HMT Technology Corporation | Textured Thin-Film Substrate And Method (P) |
| 5,209,837 | Tsuya et al | — | Process For Preparing Magnetic Disk (PE) (CE) |
| 5,210,673 | Ito et al | Hitachi Metals, Ltd. | Thin-Film Hard Disk Magnetic Medium (CG) |
| 5,223,304 | Yasuda et al | Sumitomo Metal Mining Company, Ltd. | Process For Fabricating Magnetic Disks (P) |
| 5,225,955 | Ito et al | Hitachi Metals, Inc. | Disk-Shaped Magnetic Recording Medium Having Novel Textured Surface (CG) |
| 5,232,750 | Onodera et al | Fuji Electric Co., Ltd. | Method For Fabricating Magnetic Recording Medium (US) |
| 5,250,339 | Tani et al | Nihon Shinku Gijutsu Kabushiki Kaisha | Magnetic Recording Medium (CG) |
| 5,268,207 | Kruger et al | IBM | Texturing The Surface Of A Recoridng Disk Using Particle Impact (US) |
| 5,285,343 | Tanaka et al | Hitachi, Ltd. | Magnetic Disk With Surface Protective Layer Having Convex Portions And Magnetic Disk Apparatus Including Such A Magnetic Disk (CE) |
| 5,316,864 | Hedgcoth | — | Sputtered Magnetic Recording Disc (CG) |

CODE TABLE
CE — Chemical Etching
CG — Circumferential Grooving
G — Globule
H — Heat
L — Laser
M — Miscellaneous Mechanical
ME — Masking/Etching
P — Particles
PE — Plasma Etching
PO — Pores
PP — Pore Packing
US — Ultra Sonic

GENERAL SUMMARY OF INVENTION

Having described the general state of the prior art and principle aspects of the invention, it is now appropriate to review the invention with respect to its independently significant aspects.

Basic Aspects

A basic method of fabricating thin film, magnetic discs is first presented, this method comprising:

A) providing a disc substrate;

B) sputter depositing a eutectic alloy of Indium and Bismuth upon the substrate to define a series of discrete globules of the eutectic alloy of Indium and Bismuth, generally non-wettingly engaging the substrate, with the discrete eutectic alloy globules of Indium and Bismuth defining a roughened exposed exterior on the substrate; and C) sputter depositing a thin film of magnetic media upon the toughened, exposed exterior of the substrate with the exterior of the deposited thin film of magnetic media being micro-textured in response to the depositing over the substrate of the eutectically alloyed globules of Indium and Bismuth.

A basic apparatus is herein presented for fabricating thin film, magnetic discs, this apparatus comprising:

A) means providing a disc substrate;

B) means for sputter depositing a eutectic alloy of Indium and Bismuth upon the substrate to define a series of discrete globules oft he eutectic alloy of Indium and Bismuth, generally non-wettingly engaging the substrate, with the discrete eutectic alloy globules of Indium and Bismuth defining a roughened exposed exterior on the substrate; and C) means for sputter depositing a thin film of magnetic media upon the roughened, exposed exterior of the substrate, with the exterior of the deposited thin film of magnetic media being micro-textured in response to the depositing over the substrate of the eutectically alloyed globules of Indium and Bismuth.

A basic micro-textured magnetic disc according to this invention is presented, this disc comprising:

A) a disc substrate;

B) a eutectic alloy of Indium and Bismuth sputter deposited upon the substrate to define a series of discrete globules of the eutectic alloy of Indium and Bismuth, generally non-wettingly engaging the substrate, with the discrete eutectic alloy globules of Indium and Bismuth defining a roughened exposed exterior on the substrate; and C) a thin film of magnetic media sputter deposited upon the roughened, exposed exterior of the substrate, with the exterior of the deposited thin film of magnetic media being micro-textured in response to the depositing over the substrate of the eutectically alloyed globules of Indium and Bismuth.

Detailed Aspects

Independently significant aspects of each of the foregoing method, apparatus, and disc components of the invention reside in specific, features as follows.

A first refinement contemplates:

the eutectic alloy of Indium and Bismuth having a relatively low melting point relative to the surface energy of the substrate operable to enhance (1) the formation of said discrete globules during the sputtering of said eutectic alloy and (2) the formation and the retention of micro-texturing on the substrate, such being caused by the caused by the presence and at least partial solidification of the globules.

A second and further refinement contemplates:

the eutectic alloy of Indium and Bismuth being substantially free of reaction with the magnetic media thin film; and the eutectic alloy of Indium and Bismuth substantially solidifying as non-transitory, solid phase, generally discrete globules of a eutectic alloy of Indium and Bismuth on the substrate prior to sputter depositing of said thin film magnetic media.

Another refinement, and especially advantageous aspect of this invention, resides in the preconditioning of a substrate such as a conventional aluminum disc comprising a nickel phosphorous (NIP) treated aluminum base of the type commonly employed in hard disc manufacture. The surface of this aluminum disc, normally wettable by the eutectic alloy material as sputter deposited, is uniquely treated so as to render it relatively non-wettable. This may be accomplished by the sputtered deposition of a conditioning layer, such as Tantalum Oxide ($Ta_2 O_5$) or Titanium Oxide, etc., on the aluminum disc before the sputter deposition of the eutectically alloyed Indium and Bismuth. Tantalum Oxide is believed to be uniquely effective for this purpose.

In describing the invention, an exemplary reference will be made to the application of the Indium Bismuth eutectic alloy SIMT technique, applied to an appropriately conditioned aluminum substrate. As will be understood from the context of the disclosure of this invention, this SIMT application of the invention to an appropriately conditioned, initially wettable substrate may be practiced with or without an initial texturing of the substrate, preceding the SIMT treatment. A first stage texturing may involve etching of the substrate, primarily in the head landing zone, as generally described in United States patent application Ser. No. 275, 969, noted above and incorporated herein by reference. Pre-texturing of the head landing zone of the disc may also be effected by etching a layer on the exterior of the disc, such as the outer overcoat carbon layer of many commercial discs utilized today.

This SIMT concept may be practiced without substrate conditioning where an initially non-wettable substrate such as glass is used, with or without supplemental texturing as above suggested.

BRIEF DESCRIPTION OF THE DRAWINGS

In describing the invention with respect to presently preferred embodiments, reference will be made to the appended drawings in which.

DETAILED ASPECTS OF PREFERRED IMPLEMENTATION OF INVENTION

Overview

Figure 1:
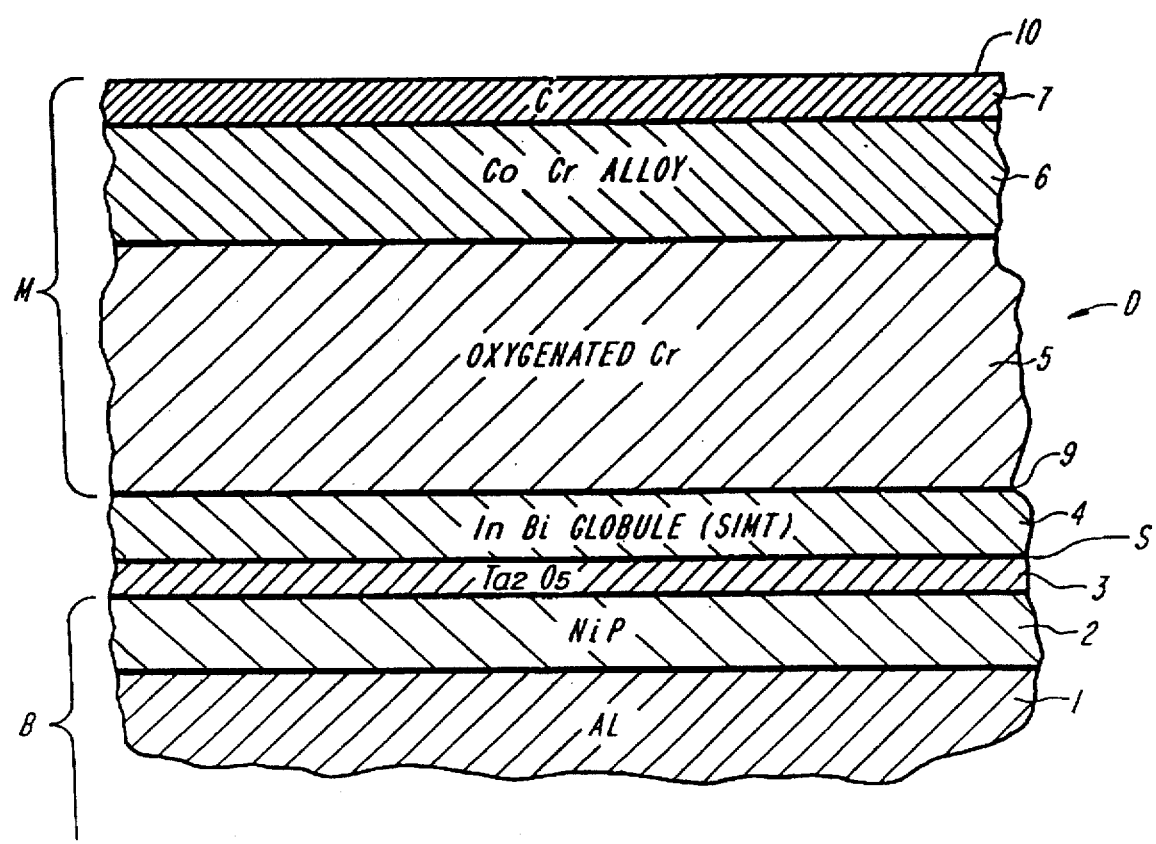
FIG. 1 schematically depicts the lamina of a disc provided with sputter induced micro-texturing in accordance with a presently preferred embodiment of the invention.

As has been earlier indicated, the present invention is basically concerned with a unique application of a specific, Indium/Bismuth eutectic alloy as a vehicle for providing sputter-induced micro-texturing on an appropriate substrate surface, i.e., a substrate surface which is relatively non-wettable by the SIMT material.

In practicing the invention, it may be applied as a single stage, texturing technique, involving the formation of texturing globules on an oxide conditioned, nickel phosphorous/aluminum substrate disc or on a glass substrate, for example.

Alternatively, and in some cases optimally, this SIMT texturing may be performed in the context of a multi-stage texturing operation, much like that contemplated in applicants' Teng et al application Ser. No. 275,969, filed Jul. 15, 1994, above noted. This application specifically addresses the unique advantages attributable to the use of sputter induced micro-texturing to supplement chemical etching of the landing zone of a substrate, prior to the performing of SIMT substantially across the entire operating area of the disc. This application Ser. No. 275,969 expressly discloses the use of the Indium/Bismuth eutectic alloy of this invention applied in the context of composite texturing of a glass substrate, for example.

Thus, as will be recognized, the present invention has particularly efficacious application in the context of composite micro-texturing and may be effectively applied to aluminum substrates as well. This invention affords a technique for rendering nickel phosphorous/aluminum substrates effectively amenable to SIMT treatment by rendering the initially wettable substrate relatively non-wettable by the SIMT material, thereby promoting the formation and retention of texturing globules. Such aluminum substrates may be pretextured in the normal head landing zone by etching, as generally taught by the United States Sakai et al U.S. Pat. No. 4,675,075 (1987).

Moreover, it will be recognized that this present invention is applicable to a composite micro-texturing technique wherein SIMT is applied initially to the disc substrate, following which media and interface layers are applied and a final protective layer, often carbon, is sputter deposited and lubricated. As is recognized, for example, in United States Tanaka et al U.S. Pat. No. 5,285,343 (1994), etching-type texturing may be applied directly to the carbon overcoat, rather than to the substrate, so as to obtain the desired enhanced degree of lubricant retention capabilities and stiction reduction in the normal head landing zone.

Whether applied in the context of composite micro-texturing as noted above, or by itself, the present invention is basically characterized by sputter induced micro-texturing with a eutectic alloy of Indium and Bismuth. This technique deposits texturing globules of In/Bi on a non-wettable substrate surface, i.e., a surface which is non-wettable by the SIMT material. The unique advantages of the special SIMT material of the present invention, providing optimization of the formation of texturing globules, are able to be achieved even with initially wettable substrates, such as aluminum discs, by conditioning the surface thereof with a sputter deposited, non-wettable surface.

In pursuing this discussion, it will be recognized that while the disclosure and presentation hereinafter are directed to the formation of micro-texturing essentially on a substrate surface, the attained micro-texturing will be reflected substantially in surface texturing on the outer surface of the disc. While the deposition of media, interface, and protective layers on the SIMT treated substrate may, to some extent, diminish the globule definition, it has been observed that the SIMT formation on the treated substrate does effectively "carry through" the subsequently sputter applied layers so as to provide an effective and desirable degree of surface texturing on exterior of the final disc product.

Advance In Relation To The Prior Art

This new surface texturing concept, applicable to either initially wettable or initially non-wettable substrates, involves a specific eutectic alloy, i.e., an alloy of Indium and Bismuth, where the desired degree of microtexturing is achieved by the use of this alloy and state of the art sputtering techniques and appropriate by considering:

a. Eutectic alloy melting point;
b. Eutectic alloy film thickness;
c. Substrate surface tension; and
d. Alloy application temperature.

So far as is known, there is no prior art disclosing a seed layer comprising an Indium/Bismuth seed layer, and especially such formed on a non-wettable overcoating for an aluminum substrate such as Tantalum Oxide.

Prior art encountered, as above noted, includes the Baseman et al U.S. Pat. Nos. 5,134,038 and 5,053,250 which disclose the use of each of Indium and Bismuth but certainly do not expressly disclose an alloy of these materials as the seed layer and clearly do not disclose this particular seed layer forming alloy being deposited upon a non-wettable overcoat for an aluminum substrate.

Baseman et al specifically disclose globules which might be comprised of Indium or Bismuth as well as a large number of other metals and notes the possibility of alloys with "other elements".

Thus, the Baseman disclosures not only do not identify an Indium/Bismuth, seed layer globules concept but appear to teach away from alloys of these two materials and certainly do not contemplate a eutectic alloy of these two materials.

With respect to the substrate, it is to be noted that Baseman et al contemplate substrates including silicon dioxide which may be provided as a coating on a suitable non-magnetic substrate. The specification of 5,134,038 further indicates that the substrate is selected to be non-wettable by the seed layer material (see Column 4 at about lines 33–35).

Yazawa U.S. Pat. No. 4,539,265 has also been noted which, while appearing to be limited to the use of bismuth, antimony, or tantalum for forming globules, specifically contemplates a substrate which may comprise a silicon or silicon compound layer deposited upon a non-magnetic substrate which may be metallic (see FIG. 3 and accompanying discussions relating to FIG. 3 in Column 4 of the specification along with discussion of FIG. 1 appearing in Column 3 of the specification).

Moreover, applicants earlier seed layer, defining, peritectic, silver/tin alloy disclosure in U.S. patent application Ser. No. 959,986 (Mahvan et at), pertains to globule formation but neither the eutectic alloy nor substrate conditioning of this invention.

In addition to the failings in the prior art to suggest or anticipate the present concept, as noted above, the predominant pre-occupation in the art with chemical or mechanical texturing techniques further teaches away from the present concept, such prior art being exemplified by the patents in the table set forth above.

SIMT Implementation

As is shown in FIG. 1, the present invention produces a disc structure D, shown in schematic cross section characterized by:

An aluminum base 1;

A nickel phosphorous treated surface layer 2 (conventional) for the outer surface of the aluminum disc B (defined by base 1 and surface layer 2), rendering it acceptably smooth;

A conditioning layer 3 of tantalum oxide, titanium oxide, etc. sputter deposited on the nickel phosphorous outer surface 8 of the aluminum disc B so as to provide a relatively non-wettable deposition surface S for the subsequently sputter applied SIMT;

The sputter induced micro-texturing layer 4 comprising sputter deposited globules 4a (see FIGS. 2 and 3) of a eutectic alloy of Indium and Bismuth;

An interface layer 5 which may comprise oxygenated chromium applied over the SIMT layer 4;

A sputter deposited media layer 6 which may comprise a cobalt, chromium platinum alloy, possibly including other alloy material such as tantalum; and A sputter deposited carbon overcoat layer 7, which would conventionally be treated by the application of lubricant material, burnishing, etc.

As will be appreciated, layers 5, 6 and 7 may be appropriately referred to as thin film means M of magnetic media, having an exposed, outer surface 10.

By way of depicting one dimensional example, the layers noted above may be sputter deposited to the following approximate thickness levels:

| Layer | Approximate Thickness (Angstroms) |
| --- | --- |
| 3 | 80± |
| 4 | 150± to 250± |
| 5 | 1000± |
| 6 | 500± |
| 7 | 200± |

In the ensuing discussion, the invention will be discussed in the context of utilizing the SIMT technique of this invention to produce a disc product characterized by:

A) An aluminum disc substrate B, this substrate B, having a surface 8 wettable by a magnetic media nucleating, seed layer material 4;

B) A substrate conditioning layer 3 of an oxide of Tantalum on the wettable substrate surface 8, this substrate conditioning layer 3 comprising an oxide of Tantalum defining and providing a seed layer receptor which is relatively non-wettable by the seed layer material;

C) A layer 4 comprising a eutectic alloy of Indium and Bismuth sputter deposited upon the substrate conditioning layer 3 of an oxide of Tantalum to define a series of discrete globules 4a of the eutectic alloy of Indium and Bismuth generally, non-wettingly engaging the substrate conditioning layer 3 of Tantalum Oxide, with the discrete eutectic alloy globules of Indium and Bismuth defining a roughened exposed exterior 9 on the substrate conditioning layer; and D) Thin film means M of magnetic media sputter deposited upon the roughened, exposed exterior, with the exterior 10 of the deposited thin film means of magnetic media being micro-textured in response to the depositing over the Tantalum Oxide substrate conditioning layer of the eutectically alloyed globules of Indium and Bismuth.

The eutectic alloy of Indium and Bismuth has a relatively low melting point, relative to the surface energy of the Tantalum Oxide conditioning layer 3 and substrate 1, 2 operable to enhance the formation of the discrete globules 4a (see FIGS. 2 and 3) during the sputtering of the eutectic alloy and the formation and retention of micro-texturing on the tantalum oxide substrate conditioning layer caused by the presence and at least partial solidification of these globules 4a.

The eutectic alloy of Indium and Bismuth 4 is believed to be substantially free of reaction with the magnetic media thin film means 5, 6. The eutectic alloy of Indium and Bismuth is further believed to substantially solidify as non-transitory, solid phase, discrete globules 4a of a eutectic alloy of Indium and Bismuth on the Tantalum Oxide substrate 3 conditioning layer prior to the sputter depositing of the thin film means M of magnetic media.

This invention advantageously employs the sputter deposition of globules comprising a eutectic alloy of Indium and Bismuth as featured in the publication of Teng, Nguyen, and Eltoukhy entitled "Sputter-Induced Random Micro-Texturing On NiP Plated Aluminum And Alternate Substrates" (Teng et at, published at the 6th Joint MMM-Intermag Conference at Albuquerque, N.M. on Jun. 20–23, 1994). The disclosure of this paper is herein incorporated by reference. Hereinafter, reference to this paper will identify it as the "Teng et al paper".

Having generally set the stage for basic aspects of the invention and the context of the invention in relation to its advance in the art, it is now appropriate to set forth a detailed discussion of the SIMT concept of this invention.

SIMT Concept Research

Random micro texturing can be developed on both NiP/Al and alternate substrate disks by sputtering nonwetting and seed layers. The nonwetting layer will first be sputtered on the substrate, then the seed layer, chrome underlayer, CoCrPtTa magnetic layer and carbon overcoat will be sequentially deposited on top of the nonwetting layer. The seed layer melting point, film thickness, substrate surface energy, and temperature are believed to be parameters which this invention recognized as affecting the properties and characteristics of sputter-induced micro texturing (SIMT) with a eutectic alloy of Indium (35% by weight) and Bismuth (65% by weight). Those in possession of this recognition of parameters and possessed of the existing skill level in this art will be able to appropriately explore proper parameters in accordance with substrate criteria, etc.

The surface topography and roughness of micro texturing have been evaluated, using SEM, Atomic Force Microscope (AFM), and glide height avalanche tests. Tribology tests were conducted using 1 RPM stiction test and a CSS test on disk drives equipped with semiconductor strain gauges. By carefully controlling process parameters it has been found that, the number of texturing summits at the desired threshold level can be increased significantly without changing the surface roughness as measured by optical interferometry. Consequently, disk stiction can be greatly improved without deteriorating glide performance.

To achieve ultra high magnetic recording density in disk drives, the recording head and disk must be in contact or very nearly so. This requires recording disks having smoother surfaces but lower stiction. Thus the surface roughness and texturing are key elements in contact recording. Virtually all thin film disks for magnetic data storage use either mechanically textured NiP plated N1 substrates or smooth alternate substrates. Mechanical texturing on NiP may achieve acceptably low stiction but suffers a higher glide height. Smooth, alternate substrates such as glass may achieve lower glide height but at the price of high stiction. A new technique of sputtering a transient metal underlayer to produce thin film disks with isolated spherical features and controllable surface roughness was recently suggested (Paper 1 referred to in "References" at end of "Teng et al paper"). However, most of that work was limited to non-metallic substrates which intrinsically have lower surface tension and better nonwetting property than NiP plated Al substrates. This paper will demonstrate that by sputtering an optimized seedlayer and nonwetting layer (NWL), the random microtexturing can ben developed not only on glass substrates, but also on NiP plated Al substrates.

In this invention, the multilayer films of seedlayer/Cr/ CoCrPtTa/carbon and NWL/seedlayer/Cr/CoCrPtTa/Carbon are deposited on polished NiP/Al and alternate substrates by an in-line DC/RF magnetron sputtering system. The surface roughness has been measured by Wyko interferometer with X-40 lens and the Digital Instruments AFM, respectively. The grain size and surface topograhy were characterized using Hitachi S-4100 field emission SEM. The glide height avalanche was performed by the Cam-brian MSA 450, starting from low velocity to high velocity, and counting the number of head-disk contacts over 1 volt threshold. The tribology tests were conducted with 5 gram 50% nanoslider thin film head. The signal waveform modulation was measured by a 501 Guzik tester with ReadRite thin film heads of 70% slider.

Table 1 of the "Teng et al paper", reproduced below, shows the surface roughness and grain size of canasite substrates sputtered with different seedlayers. The melting points of seedlayer varied from 480° C. to 90° C. Roughness measurement by Wyko shows very little difference between disks with and without seedlayers. However, roughness measurement by AFM shows that the disks sputtered with lowest melting point seedlayer ($3), i.e., the Indium Bismuth eutectic alloy of this invention demonstrated roughest surfaces. It was also observed that the overall roughness measured by AFM was much higher than those measured by Wyko. The difference was attributed to the lower sensitivity of Wyko instrument at the micro-texturing scale. Furthermore, much larger gains were grown on the disks with seedlayers of In/Bi eutectic globules, thus resulting in rougher surface, i.e., the sputterinduced micro texturing (SIMT) of this invention.

As Table 1 shows, the desired coarseness in texturing of the eutectic, Indium/Bismuth alloy example S3 is notably superior to the markedly less coarse texturing produced by tin/silver alloys (Examples S1 and S2 of Table 1).

FIG. 1 of the "Teng et al paper" shows the AFM topography of cansite surface with and without SIMT structure. As expected, the SIMT disks shows very clearly defnied grain features of 120 nm and the regular disk with normal grain size of 30 nm [See reference 2 at end of the Teng et al paper]. To investigate the effect of substrate surface energy on the properties and characteristics of SIMT disks, polished NiP/Al substrates were sputtered without and with seedlayer 83, and the nonwetting layer. FIG. 2(a) of the "Teng et al paper" shows the SEM photograph of disk surface without any seedlayer. Its grains were so fine that it was hard to see any texture pattern. There were some polishing scratches observed.

TABLE 1

Roughness and grain size comparison between canasite disk sputtered with different seedlayer.

| Seedlayer | Melting point (°C.) | Ra* (Å) | Ra** (Å) | Grain size (nm) |
|---|---|---|---|---|
| NO | — | 18.1 | 26.1 | 30 |
| S1 | 480 | 17.8 | 28.3 | 50 |
| S2 | 231 | 18.7 | 32.2 | 80 |
| S3 | 90 | 18.5 | 40.7 | 120 |

*Measured by Wyko;
**Measured by AFM.

FIG. 2(b) of the "Teng et al paper" shows the SEM photograph of disks with only the S3 seedlayer. The grain size was found unevenly distributed from 30 nm to 300 nm. Furthermore, the grain shape was very irregularly varied from spherical to triangular features. It was believed due to the high critical surface energy of the metallic solids [See reference 3 at end of Teng et al paper]. To reduce the S3 spreading ability, a nonwetting layer (NWL) was sputtered on top of NiP/Al substrate prior to depositing the S3 seedlayer. FIG. 2(c) shows the SEM photograph of such multilayer structure and a much more uniform grain size distribution was observed. A similar grain size and structure were also observed on the glass disk with S3 seedlayer only (FIG. 2(d)) of the "Teng et al paper". FIG. 3 (Teng et al paper) shows the substrate temperature effect on the surface morphology of NiP/Al substrates sputtered with both nonwetting and seedlayers. Improper heating on the substrate would affect the mobility of S3 atoms and induce some huge grains which could impact glide and wear performance. It was also observed that most large grains were aligned inside the polishing scratch grooves.

FIG. 4 (Teng et al paper) shows the 1 RPM stiction results of polished NiP/Al disks with same NWL but different S3 seedlayer thickness. Without S3 seedlayer, the stiction coefficient was as high as 1.1. With the S3 seedlayer, the stiction coefficient was reduced and, at 200Å seedlayer thickness, the stiction coefficient was reduced to 0.5. The improved stiction here was apparently because of reduced surface contact between the disk and the head slider as a result of the rough surface induced by the large grains. FIG. 5 (Teng et al paper) shows the CSS test results on polished NiP/Al with and without SIMT. The disk without SIMT exhibited very high initial stiction (~20 grams); reaching 35 grams after 3K s/s cycles (FIG. 5(a) of Teng et al paper). The disk with 15 nm S3 shows a low initial stiction (~7 grams), and the peak stiction was found to remain unchanged even after it had been in contact with the slider for 15K s/s cycles, as shown in FIG. 5(b) of the "Teng et al paper". However, with very thick S3 seedlayer, the initial stiction was very low (~6 grams), the peak stiction became very erratic after 2K s/s cycles, and a wear track was observed on the disk after 6K s/s cycles (FIG. 5(c) of Teng et al paper). FIG. 6 of the Teng et al paper depicts the glide avalanche results of different roughness NiP/Al and alternate substrates with and without SIMT. Because of the intrinsic tendency of sputtered films to conform to substrate morphology, SIMT did not generate any outstanding singular features which would allow head-disk contacts like those seen with mechanical texturing. Thus the SIMT disks would not deteriorate glide performance. It was found that the polished Nippon sheet glass with SIMT structure showed the best glide height avalanche of 1.0 microinch.

FIG. 7 (Teng et al paper) shows the signal waveform modulation of NiP/Al and alternate substrate with and without SIMT. The NiP/Al disk shows a reasonably good low frequency modulation but poor frequency modulation (FIG. 7(a) Teng et al paper). The polished glass disk without SIMT shows a reasonable high frequency modulation but poor low frequency modulation (FIG. 7(b) of Teng et al paper). The polished glass disk with SIMT shows the best modulation at both low and high frequencies (FIG. 7(c) of Teng et al paper).

Sputter-induced random micro texturing has been developed on both NiP/Al and alternate substrate disks by sputtering the optimized nonwetting layer and seedlayer. The grain size of the disks with SIMT structure was several times larger than that of the disks without SIMT structure, and resulted in a desirably rougher surface. The seedlayer melting point and the substrate surface energy had to be compatible to make even grain distribution with spherical features. Improper substrate temperature and too thick seedlayer would also cause abnormal large grains and isolated high spots which could impact the disk glide and CSS performance. By carefully controlling process parameters, super-smooth alternate substrate disks with SIMT have been produced that demonstrated 1 microinch glide height capability and exceptionally good waveform modulation.

Research Results

The globule layer melting point, film thickness, substrate surface energy, and temperature may significantly affect the properties and characteristics of the sputter-induced micro texturing (SIMT) comprising the array 4. By controlling process parameters, the number of globule texturing summits at the desired threshold level can be increased significantly without changing the surface roughness as measured by optical interferometry. Consequently, disk stiction can be greatly improved without deteriorating glide performance.

To achieve ultra high magnetic recording density in disk drives, the recording head and disk must be very nearly in contact. This requires a disk with smoother surface but lower stiction. Thus the surface roughness and texturing will be key elements in recording effectiveness. Virtually all thin film disks for magnetic data storage use either mechanically textured NiP (Nickel Phospate) plated Al (Aluminum) substrates or smooth alternate substrates such as glass or ceramic material. Mechanical texturing on NiP may achieve acceptably low stiction but produce a higher glide height. Smooth substrates may achieve lower glide heights but at the price of high stiction.

By referring to FIG. 7 of the aforesaid Teng et al paper, it will be better appreciated how the eutectically alleged, globular Indium Bismuth micro-texturing (referred to as sputter induced micro texturing or SIMT) truly enhances modulation properties of a media disc. With a normal, aluminum substrate (relatively rough surfaced), the observed signal waveform evidences good low frequency modulation but poor high frequency modulation (note curve A of FIG. 7 of this paper). With a glass substrate, not textured, the signal waveform shows reasonable high frequency modulation but poor low frequency modulation (see curve B of FIG. 7 of this publication). However, with the SIMT structure of this invention, a glass disc micro-textured with eutectic alloy globules, as above described, displays a signal waveform possessing the best, and significantly improved modulation, at both high and low frequencies (see curve C of FIG. 7 of this Teng et al paper).

The multilayer films of seedlayer (i.e., globules), media layers, and carbon of the present invention may be deposited on substrates by commercially available, in-line, DC/RF magnetron sputtering systems.

The micro-texturing layer of this invention uniquely provides micro-texturing and performs a seed layer function, generally consistent with the observations of the aforesaid Teng et al paper and research results presented therein.

As presently advised, the micro-texturing stage is performed by sputtering with eutectic alloy targets comprising Indium (about 65% by weight) and Bismuth (about 35% by weight). This produces eutectic alloy globules 4 of essentially the same and uniform composition which are not believed to interact with the media layers, in the manner apparantly contemplated by prior art such as the above listed Baseman et al patents.

As noted, sputter-induced random micro texturing of this invention (SIMT) has been developed for both NiP/Al and alternate substrate disks such as glass, etc., such entailing the deposition of the micro-texturing seedlayer. The grain size of media layers of disks with SIMT structure has been noted to be several times larger than that of disks without SIMT structure, and results in desirably, somewhat rougher surfaces, i.e., outer surfaces of the final disc product. The seedlayer melting point and substrate surface energy have to be compatible to yield even grain distribution with spherical globule features. Improper substrate temperature and too thick a seedlayer could cause abnormally large grains and isolated high spots which could impact the disk glide and CSS performance. By controlling process parameters within the skill level of the art and the knowledge imparted through this disclosure, and within the technical knowledge level of present practitioners of this art, substrate disks with SIMT have been produced that demonstrated an appropriate 1 microinch glide height capability and exceptionally good waveform modulation.

In passing, it should be noted that the media itself may advantageously incorporate flash chromium interface layers between magnetizable media layers, consistent with the novel concept described in the pending applications of Teng and Eltoukhy, Ser. No. 887,187, filed May 21, 1992 entitled Flash Chromium Interlayer For Improved Hard Disc Magnetic Recording Peformance, and assigned to the assignee of the present invention.

Summary of Description

Basic overall aspects of the invention may now be summarized, with details of the micro-texturing operation, apparatus, and disc having been reviewed and described above.

In a method sense, and where aluminum substrate discs are to be micro-textured, these basic aspects reside in the following combination concepts, it being recognized that direct apparatus and disc counterparts of the method aspects of the invention co-exist with the related method.

First and foremost, a base method of compositely micro-texturing thin film, magnetic discs is contemplated, this method comprising:

A) providing a disc substrate 4B,
   this substrate 1, 2, i.e., M, having a surface 8 wettable by a magnetic media nucleating, seed layer material 4;

B) depositing a substrate conditioning layer 3 of an oxide of Tantalum on the wettable substrate surface 8,
   the substrate conditioning layer 3 of an oxide of Tantalum defining and providing a seed layer receptor which is relatively non-wettable by the seed layer material 4;

C) sputter depositing a eutectic alloy of Indium and Bismuth 4 upon the substrate conditioning layer of an oxide of Tantalum to define
   a series of discrete globules 4a (FIGS. 2 and 3) of the eutectic alloy of Indium and Bismuth, generally non-wettingly engaging the substrate conditioning layer 3 of Tantalum Oxide, with
   the discrete eutectic alloy globules of Indium and Bismuth defining a roughened exposed exterior 9 on the substrate conditioning layer 3, and D) sputter depositing a thin film means of magnetic media 5, 6, 7 upon the toughened, exposed exterior 9 with
   the exterior 10 of the deposited thin film means of magnetic media being micro-textured in response to the depositing over the Tantalum oxide substrate conditioning layer of the eutectically alloyed globules of Indium and Bismuth.

As has been noted, in a broader sense, this method may be practiced without utilizing the substrate conditioning steps. However, such adds materially to the value of the invention in rendering SIMT effective with normally wettable substrate bases.

SUMMARY OF DETAILED ASPECTS OF THE INVENTION

In the context of the basic method, apparatus, and basic disc aspects of the invention as above noted, particularly efficacious results are believed to be derived from a detailed implementation of the invention, characterized in the method refinement of the invention as follows (such of course being mirrored in counterpart apparatus and disc aspects):

Any method as described above wherein:

the eutectic alloy of Indium and Bismuth has a relatively low melting point relative to the surface energy of the conditioning layer and substrate so as to be operable to enhance 1) the formation of the discrete globules 4a during the sputtering of the eutectic alloy and the formation and
2) the retention of SIMT on the Tantalum Oxide substrate conditioning layer caused by the presence and at least partial solidification of the globules; and/or the eutectic alloy of Indium and Bismuth being substantially free of reaction with the magnetic media thin film 5, 6; and the eutectic alloy of Indium and Bismuth substantially solidifying as non-transitory, solid phase, generally discrete (albeit possibly partially merged at their bases where they are engaged with the conditioning layer) globules 4a of a eutectic alloy of Indium and Bismuth on the Tantalum Oxide substrate conditioning layer, such being believed to occur prior to sputter depositing the thin film magnetic media.

Figure 2:
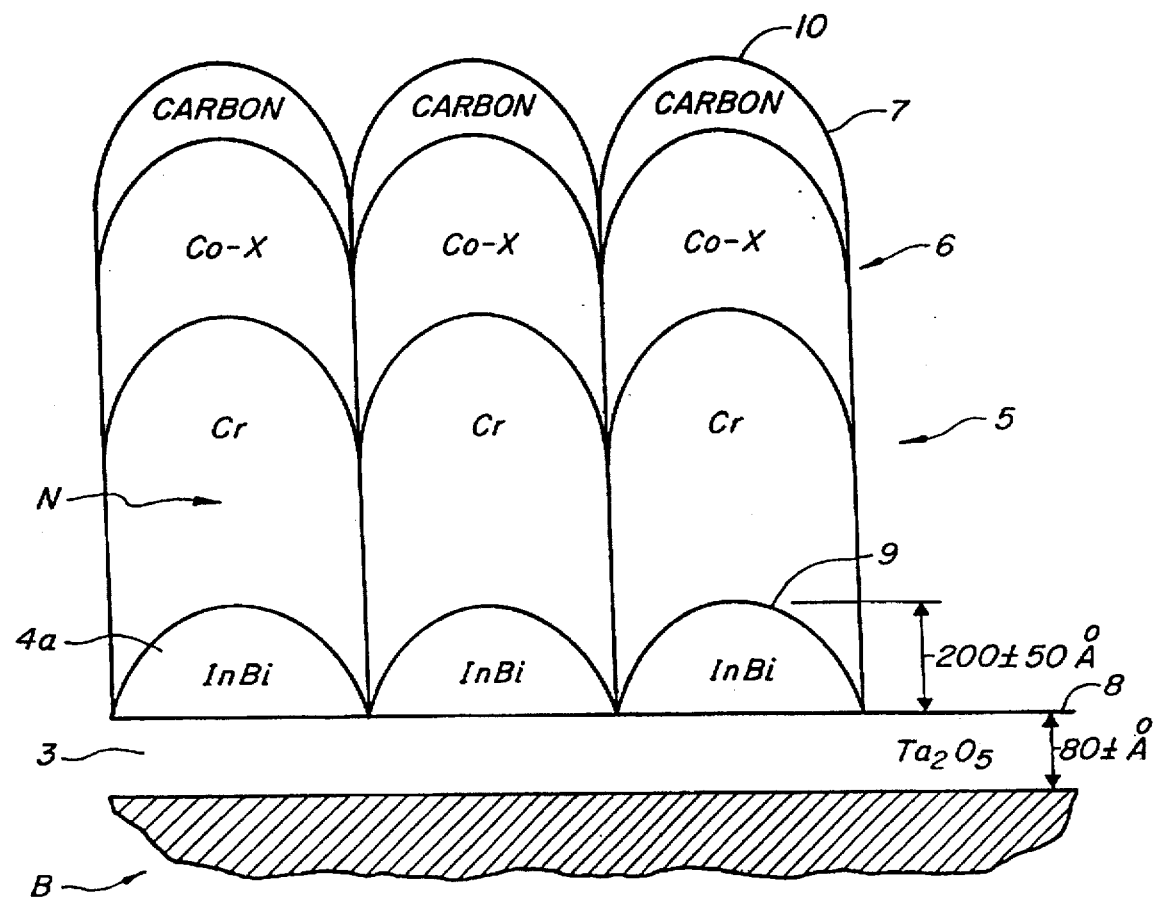
FIG. 2, in an enlarged format, depicts the eutectically alloyed, Indium/Bismuth globules which provide micro-texturing on the substrate, this micro-texturing being reflected through the subsequently sputter deposited magnetic media and protective overcoat layers of the disc to provide external disc texturing.
Figure 3:
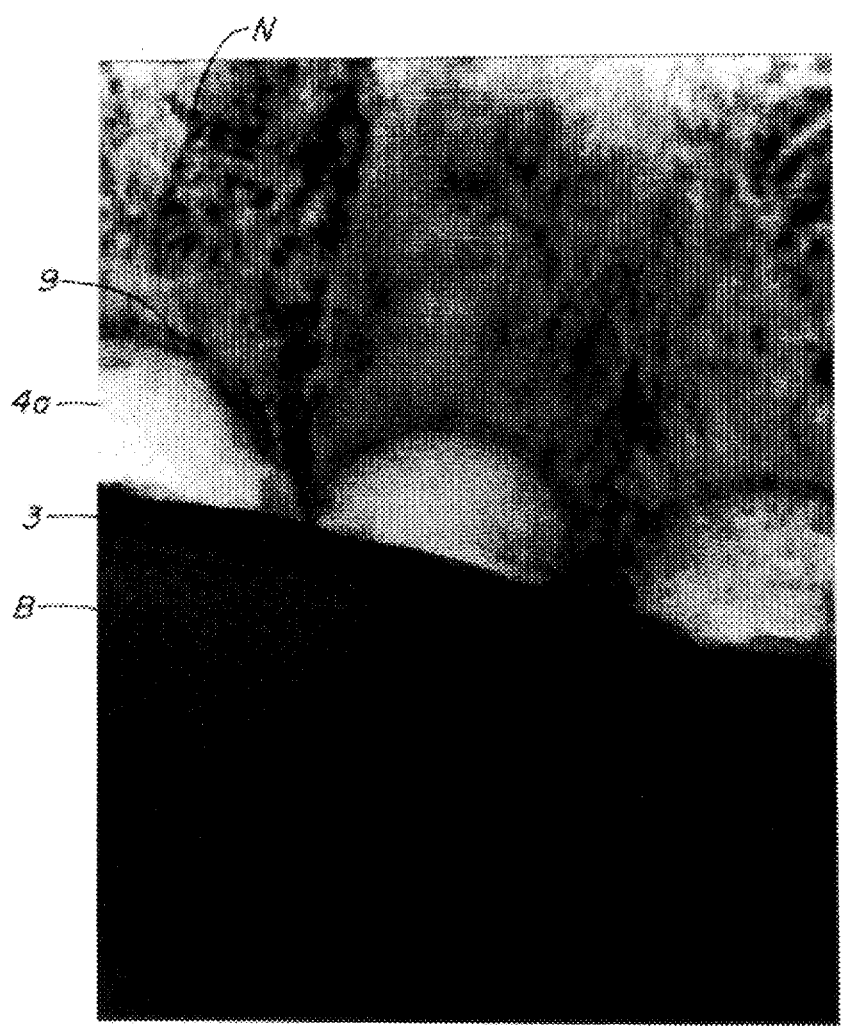
FIG. 3 provides a TEM cross-sectional view corresponding to the schematic display of FIG. 2.

As is schematically depicted in FIG. 2, and clearly revealed by the TEM showing of FIG. 3, the eutectically alloyed globules 4a of Indium and Bismuth operate to define desired nucleating zones N for the magnetic layer means 5, 6. Moreover, as FIG. 2 of this application schematically represents, and as is shown in the SEM photographs of FIG. 2 of the Teng et al paper, the texturing defined by the generally discrete globules 4a on teh substrate is reflected effectively through the thin film means M to provide an optimally, micro-textured disk exterior surface 10.

SUMMARY OF ADVANTAGES AND OVERALL SCOPE OF INVENTION

Through the present invention, there has been presented a uniquely effective micro-texturing technique (SIMT) entailing the use of a specific, eutectic alloy of Indium and Bismuth which produces optimal micro-texturing.

The micro-texturing produced by this eutectic alloy of Indium and Bismuth is uniquely uniform with respect to globule size and configuration and is of an optimal size, producing an effective degree of micro-texturing with a desired relatively large grain size. All this is achieved while avoiding excessive disparities in "peak" and "valley" configurations and thus avoids excessive and unwanted modulation characteristics and disparities.

Stiction is effectively brought under control, with head flying characteristics being optimized.

Advantageously, the invention may be practiced with either substrates which are initially non-wettable by the SIMT material, i.e., glass, etc., or may be effectively practiced with the commercially more common aluminum substrates once such have been conditioned through the practice of the present invention so as to provide non-wettable surfaces permitting the SIMT technique to be effectively applied.

Special significance is attached to the optimal advantages derived from the use of the eutectic alloy of Indium and Bismuth in combination with an aluminum disc conditioning layer provided by sputter deposited Tantalum Oxide.

While the invention has been described with respect to presently preferred embodiments, those familiar with the micro-texturing art and this disclosure may well envision additions, deletions, substitutions, equivalents, modifications, and other changes all falling within the scope of the invention deemed to be set forth in the appended claims:

What is claimed is:

1. A micro-textured magnetic disc, said disc comprising:
A) a disc substrate
   said substrate having a surface wettable by a magnetic media nucleating, seed layer material;
B) a substrate conditioning layer of an oxide of one of Tantalum and Titanium on said wettable substrate surface,
   said substrate conditioning layer of an oxide of one of Tantalum and Titanium defining and providing a seed layer receptor which is relatively non-wettable by said seed layer material;
C) a eutectic alloy of Indium and Bismuth sputter deposited upon said substrate conditioning layer of an oxide of one of Tantalum and Titanium to define
   a series of discrete globules of said eutectic alloy of Indium and Bismuth generally non-wettable engaging said substrate conditioning layer of an oxide of one of Tantalum and Titanium,
   said discrete eutectic alloy globules of Indium and Bismuth defining a roughened exposed exterior on said substrate conditioning layer;
D) a thin film of magnetic media sputter deposited upon said roughened, exposed exterior with
   the exterior of said deposited thin film of magnetic media being micro-textured in response to the depositing, over said substrate conditioning layer of an oxide of one of Tantalum and Titanium, of said eutectically alloyed globules of Indium and Bismuth; and
E) said eutectically alloyed globules
   comprising substantially 65 percent by weight of Bismuth and 35 percent by weight of Indium,
   having a low melting point of about 90° C.,
      said low melting point of about 90° C. being operable to enhance the formation of generally uniform and discrete globules of said eutectically alloyed Indium and Bismuth, and
   having a substantially uniform but relatively large grain size of approximately 120 nanometers, with
      said relative large grain size reducing the stiction coefficient to about 0.5.

2. A micro-textured magnetic disc, said disc comprising:
A) a disc substrate
   said substrate having a surface wettable by a magnetic media nucleating, seed layer material;
B) a substrate conditioning layer of an oxide of Tantalum on said wettable substrate surface,
   said substrate conditioning layer of an oxide of Tantalum defining and providing a seed layer receptor which is relatively non-wettable by said seed layer material;
C) a eutectic alloy of Indium and Bismuth sputter deposited upon said substrate conditioning layer of an oxide of Tantalum to define a series of discrete globules of said eutectic alloy of Indium and Bismuth generally non-wettingly engaging said substrate conditioning layer of Tantalum Oxide, said discrete eutectic alloy globules of Indium and Bismuth defining a roughened exposed exterior on said substrate conditioning layer;

D) a thin film of magnetic media sputter deposited upon said roughened, exposed exterior with the exterior of said deposited thin film of magnetic media being micro-textured in response to the depositing over said Tantalum Oxide substrate conditioning layer of said eutectically alloyed globules of Indium and Bismuth; and E) said eutectically alloyed globules comprising substantially 65 percent by weight of Bismuth and 35 percent by weight of Indium, having a low melting point of about 90° C., said low melting point of about 90° C. being operable to enhance the formation of generally uniform and discrete globules of said eutectically alloyed Indium and Bismuth, and having a substantially uniform but relatively large grain size of approximately 120 nanometers, with said relatively large grain size reducing the stiction coefficient to about 0.5.

3. A micro-textured disc as described in claim 2 wherein:

said eutectic alloy of Indium and Bismuth has a relatively low melting point and is operable to enhance the formation of said discrete globules during said sputtering of said eutectic alloy and the formation and retention of micro-texturing on said Tantalum Oxide substrate conditioning layer caused by the presence and at least partial solidification of said globules.

4. A micro-textured disc as described in claim 3 with:

said eutectic alloy of Indium and Bismuth being substantially free of reaction with said magnetic media thin film; and said eutectic alloy of Indium and Bismuth substantially solidifying as non-transitory, solid phase, discrete globules of a eutectic alloy of Indium and Bismuth on said Tantalum Oxide substrate conditioning layer prior to sputter depositing of said thin film magnetic media.

* * * * *